(12) United States Patent
Jensen et al.

(10) Patent No.: US 6,748,818 B2
(45) Date of Patent: Jun. 15, 2004

(54) HIGH-PERFORMANCE FULLY-COMPLIANT MICRO-MECHANISMS FOR FORCE/DISPLACEMENT AMPLIFICATION

(75) Inventors: Brian D. Jensen, Ann Arbor, MI (US); Michael Farina, Evanston, IL (US); Katsuo Kurabayashi, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 17 days.

(21) Appl. No.: 10/144,239

(22) Filed: May 13, 2002

(65) Prior Publication Data

US 2002/0194942 A1 Dec. 26, 2002

Related U.S. Application Data

(60) Provisional application No. 60/290,837, filed on May 14, 2001.

(51) Int. Cl.$^7$ .................................................. G05G 1/00
(52) U.S. Cl. ........................ 74/470; 74/490.5; 74/490.01
(58) Field of Search .................. 74/469, 470, 471 R, 74/479.01, 490.01, 490.05

(56) References Cited

U.S. PATENT DOCUMENTS

| | | | |
|---|---|---|---|
| 3,945,304 A | | 3/1976 | Taylor |
| 4,567,771 A | | 2/1986 | Nelson et al. |
| 4,570,095 A | | 2/1986 | Uchikawa |
| 5,649,454 A | * | 7/1997 | Midha et al. |
| 5,862,003 A | * | 1/1999 | Saif et al. |
| 5,969,249 A | | 10/1999 | Roessig et al. |
| 6,100,477 A | * | 8/2000 | Randall et al. ............ 200/181 |
| 6,175,170 B1 | * | 1/2001 | Kota et al. |
| 2002/0130586 A1 | * | 9/2002 | Mao et al. ................... 310/309 |
| 2003/0032215 A1 | * | 2/2003 | Ives ............................ 438/52 |

FOREIGN PATENT DOCUMENTS

WO    WO 00/58982    * 10/2000

OTHER PUBLICATIONS

Kota, S., Hetrick, J., Li, Z., Rodgers, S., and Krygowski, T., 2000, "Sythesizing High–Performance Compliant Stroke Amplification Systems for MEMS," Proc. IEEE Micro Electro Mechanical Systems (MEMS) 2000, 00CB36308, pp. 164–169.

Chen, H. and Sun, P., 1996, "Design of Two–Layer Flexible Hinge Milli–Gripper," Proc. Intern. Symp. Micro Machine and Human Science, 96TH8213, pp. 99–104.

Goldfarb, M. and Lipsey, J.H., 1997, "Design of a Minimum Surface–Effect Tendon–Based Microactuator for Micromanipulation," Proc. IEEE Intetn. Conf. on Robotics and Automation, 97CH35992, pp. 1460–1465.

(List continued on next page.)

*Primary Examiner*—David Fenstermacher
(74) *Attorney, Agent, or Firm*—Harness, Dickey & Pierce, P.L.C.

(57) ABSTRACT

A device for amplifying mechanical and geometrical advantage having a base structure, a first link member having a first end and a second end, and a first compliant flexural joint pivotally interconnects the first end of the first link member to the base structure. A second link member is also provided having a first end and a second end. A second compliant flexural joint pivotally interconnects the first end of the second link member to the base structure. Furthermore, a third link member is provided having a first end and a second end. A third compliant flexural joint pivotally interconnects the first end of the third link member to the second end of the first link member and a fourth compliant flexural joint pivotally interconnects the second end of the third link member to the second end of the second link member. The base structure, first link member, second link member, and third link member cooperate to define a four-bar linkage for receiving an input force and providing an amplified force or displacement output in response thereto.

11 Claims, 5 Drawing Sheets

OTHER PUBLICATIONS

Huang, X.T., Saif, M.T., and MacDonald, N.C., 1996, "Micromotion Amplifier" Proc. IEEE Micro Electro Mechanical Systems (MEMS), 96CH35856, pp. 424–428.

King, T., Pozzi, M., and Manara, Angelo, 2000, "Piezoactuators For "Real–World" Applications: Can they deliver sufficient displacement?," Power Engineering Journal, vol. 14, No. 3, pp. 105–110.

Kota, S., Hetrick, J., Li, Z., and Saggere, L., 1999, "Tailoring Unconventional Actuators Using Compliant Transmissions: Design Methods and Applications," IEEE/ASME Transactions on Mechatronics, vol 4, No. 4, pp. 396–408.

Canfield, S. and Frecker, M., 2000, "Topology Optimization of Compliant Mechanical Amplifiers for Piezoelectric Actuators," Structural and Multidisciplinary Optimization, vol. 20, No. 4, pp. 269–279.

* cited by examiner

HIGH-PERFORMANCE FULLY-COMPLIANT MICRO-MECHANISMS FOR FORCE/DISPLACEMENT AMPLIFICATION

CROSS-REFERENCE TO RELATED APPLICATIONS

This application claims the benefit of U.S. Provisional Application No. 60/290,837, filed May 14, 2001. The disclosure of the above application is incorporated herein by reference.

FIELD OF THE INVENTION

The present invention relates to micro-electro-mechanical systems and, more particularly, relates to a micro-electro-mechanical system having a fully compliant four-link mechanism capable of improving the resolution of micro sensors and the displacement of micro actuators.

BACKGROUND OF THE INVENTION

In the field of micro-electro-mechanical systems (MEMS) and other micro-mechanical applications, amplifying force or displacement output of an actuator and/or a transducer permits improvements in the performance of accelerometers, actuators, and transducers. Devices that amplify force or mechanical advantage typically achieve this at the expense of displacement or geometric advantage. Likewise, devices that amplify geometric advantage do so at the expense of mechanical advantage. By multiplying the force applied to a proof mass, the resolution and signal-to-noise ratio of an accelerometer can be improved. Moreover, some types of micro-actuators, such as thermal actuators, produce large force output, but very small displacement. By amplifying displacement, actuators become useful in many more applications, such as manipulating mirrors for micro-optical circuits.

Past efforts at increasing force output for MEMS have generally relied on simple levers or gears, resulting in a typical mechanical advantage of ten or twenty. However, significantly higher mechanical advantages are often necessary in a wide range of varying applications.

Accordingly, there exists a need in the relevant art to provide a device capable of amplifying either mechanical advantage or geometric advantage. Furthermore, there exists a need in the relevant art to provide a device capable of amplifying either mechanical advantage or geometric advantage while overcoming the disadvantages of the prior art.

SUMMARY OF THE INVENTION

According to the principles of the present invention, a micro-electro-mechanical system having an advantageous construction is provided. The micro-electro-mechanical system of the present invention improves the performance of micro-electro-mechanical accelerometers by amplifying the inertial force acting on a proof mass. This arrangement improves the resolution of the accelerometer thereby increasing the signal-to-noise ratio thereof. Similarly, by amplifying the motion of a micro-actuator, the present invention allows small-stroke, large-force actuators to produce useful motion. The micro-electro-mechanical system of the present invention is fully compliant, thus allowing it to work without friction, backlash, or wear and is easily manufactured using a single mask layer. Depending on these conditions, this device is capable of multiplying force inputs by as much as 23.7 and displacement inputs by as much as 588. Efficiency of these designs improves as the two objectives (mechanical and geometric advantage) are considered jointly in a multi-criteria optimization problem rather than individually. This arrangement allows dramatic improvement in existing devices, as well as enabling technologies to be pursued that previously have not yielded sufficient signal-to-noise ratios or have not demonstrated sufficient motion for usable actuation.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Briefly, as used herein, mechanical advantage is defined as the ratio of output force to input force and geometric advantage is defined as the ratio of output displacement to input displacement.

Figure 1:
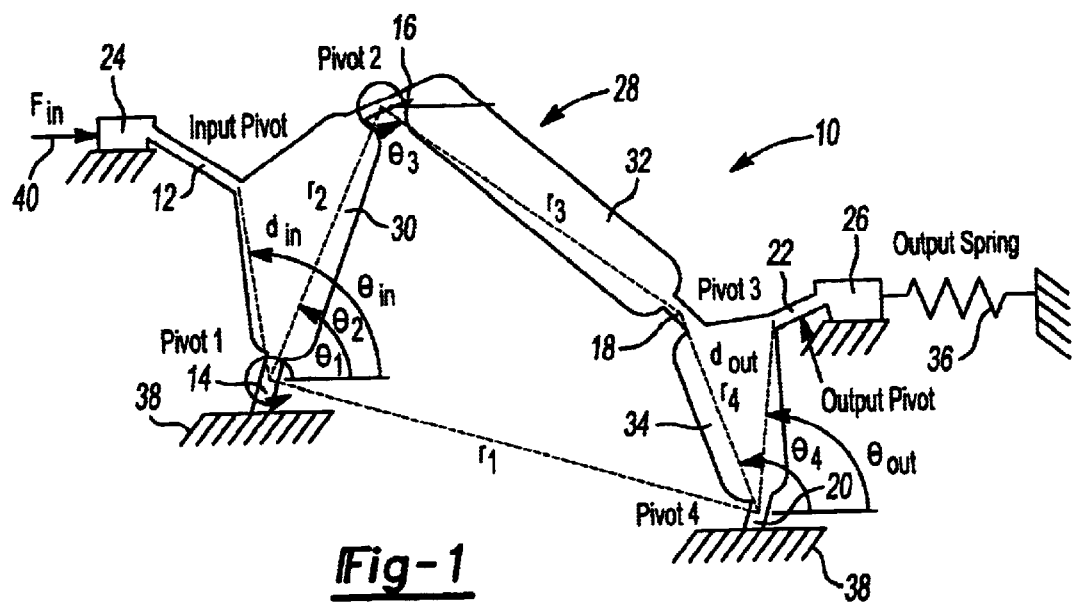
FIG. 1 is a schematic view illustrating a compliant micro mechanism according to the principles of the present invention.

According to the principles of the present invention, a compliant micro-mechanism, generally indicated at 10 in FIG. 1, is provided that is based on a four-bar linkage system capable of maximizing the mechanical or geometric advantage for a given input. A rigid-body four-bar linkage system theoretically can provide infinite mechanical or geometric advantages over small displacements depending on the specific lengths and relative positions of the linkage members. Compliant micro-mechanism 10 described herein, while not allowing infinite mechanical or geometric advantage, can produce very high mechanical or geometric advantage while also allowing simple construction and significantly reduced friction during operation.

To create a fully compliant topology, compliant micro-mechanism 10 includes a plurality of flexural pivots, namely an input pivot 12, a first pivot 14, a second pivot 16, a third pivot 18, a fourth pivot 20, and an output pivot 22, whose center lies on the joint. An input 24 and an output 26 are linked to a mechanism 28 by input pivot 12 and output pivot 22. Input 24 and output 26 are chosen to act in a straight line horizontally, allowing mechanism 28 to be connected to an actuator or transducer (not shown) operating in a straight line. In addition, the out-of-plane thickness is constant for mechanism 28, thereby allowing it to be micro-machined using planar lithography. Compliant micro mechanism 10 further includes a first generally rigid member 30, a second generally rigid member 32, and a third generally rigid member 34. First rigid member 30 is coupled to second rigid member 32 via second pivot 16. First rigid member is further coupled to input 24 via input pivot 12. Likewise, second rigid member 32 is coupled to third rigid member 34 via third pivot 18. Third rigid member 34 is further coupled to output 26 via output pivot 22. First rigid member 30 and third rigid member 34 are pivotally coupled to a base structure 38 via first pivot 14 and fourth pivot 20, respectively.

During operation, an input force 40 is applied to input 24, thereby causing input 24 to exert a force against first rigid member 30 via input pivot 12. First rigid member 30 thus pivots relative to base structure 38. This pivoting movement of first rigid member 30 drives second rigid member 32 against third rigid member 34. Third rigid member 34 thus pivots relative to base structure 38 to provide an output against output spring 36.

The resulting topology of compliant micro-mechanism 10 is best described by the following parameters, which are:

$r_1$, $r_2$, $r_3$, and $r_4$—equivalent link lengths;

$\theta_1$, $\theta_2$, $\theta_3$, and $\theta_4$—initial angle of the equivalent links $r_1$, $r_2$, $r_3$, and $r_4$, respectively;

$d_{in}$ and $d_{out}$—length of the moment arm to input pivot 12 and output pivot 22, respectively;

$\theta_{in}$ and $\theta_{out}$—angle with respect to the horizontal of the input moment arm $d_{in}$ and output moment arm $d_{out}$;

$l_1$, $l_2$, $l_3$, $l_4$, $l_{in}$, and $l_{out}$—length of equivalent link lengths $r_1$, $r_2$, $r_3$, and $r_4$ and length of input pivot 12 and output pivot 22;

$t_1$, $t_2$, $t_3$, $t_4$, $t_{in}$, and $t_{out}$—thickness of equivalent link lengths $r_1$, $r_2$, $r_3$, and $r_4$ and thickness of input pivot 12 and output pivot 22;

$\theta_{p1}$, $\theta_{p2}$, $\theta_{p3}$, $\theta_{p4}$, $\theta_{pin}$, and $\theta_{pout}$—angles with respect to horizontal of equivalent link lengths $r_1$, $r_2$, $r_3$, and $r_4$, input pivot 12, and output pivot 22;

$h_z$—out-of-plane thickness of mechanism 28;

$t_{rigid}$—the thickness of rigid members 30, 32, and 34 (assumed constant);

$F_{in}$—value of the input force; and $k_{out}$—stiffness of the output spring.

The in-plane thickness of rigid members 30, 32, and 34 is given a constant value of $t_{rigid}$ despite any real thickness changes in the mechanism. This is permissible if rigid members 30, 32, and 34 are significantly thicker than flexible segments (i.e. pivots 12–22). The compliance of rigid members 30, 32, and 34 is negligible compared to the compliance of flexural pivot 12–22. This represents a "lumped compliance" rather than a "distributed compliance" approach—the stress constraints posed in the optimization problem will prevent failure. The stiffness of the output load is modeled using a spring 36 of stiffness $k_{out}$. By varying this stiffness, the optimal design of compliant micro mechanism 10 can be found over a wide range of output loads.

A finite element model of the present invention was created using non-linear beam elements. These elements allow a combination of computational accuracy, including non-linear deflection analysis, with easy parameterization and meshing. The general topology of compliant micro mechanism 10 was parameterized using the variables outlined in the preceding section. These variables served as the input to the finite element model, which was solved in batch mode to allow an optimization program to control the selection of variable values. The displacements and reactions of compliant micro mechanism 10 were calculated for four values of input force, equal to $-F_{in}$, $-F_{in}/2$, $F_{in}/2$, and $F_{in}$. These four solutions allow determination of the linearity of the output over the range of input from $-F_{in}$ to $F_{in}$. The outputs of the finite element model were maximum stress in the mechanism, input displacement, output displacement, and output force for each level of input force. The material used for the finite element analysis was polysilicon, with assumed Young's modulus of 165 GPa and Poisson's ration of 0.23. These values are representative of literature values, although substantial variation has been observed depending on deposition and etching parameters.

The finite element model was linked to a general non-linear design optimization program using a c-code wrapper. Of the model parameters listed previously, four were chosen as parameters $t_{rigid}$, $F_{in}$, $h_z$, and $k_{out}$, and the remaining as design variables. The parameters listed in the table were chosen to represent real expected values. For example, $t_{rigid}$ was set to 20 $\mu$m; $F_{in}$ was set to 10 $\mu$N, since it is a common output force available from many electrostatic comb actuators; and $h_z$ was set to 2 $\mu$m, as a normal value of out-of-plane thickness of many surface micro-machined structural layers. For the first optimization analyses, $k_{out}$ was chosen to be 10 N/m. This is an intermediate stiffness, laying logarithmically between a stiff output of 1000 N/m (such as might be expected from a resonant accelerometer) and a very weak output of 0.01 N/m. After generating a Pareto curve for $k_{out}=10$ N/m, Pareto curves for several output stiffnesses across the listed range were produced.

The optimization problem for maximizing mechanical advantage is thus:

$$\underset{x}{\text{maximize}} \quad MA \tag{1}$$

subject to $$\sigma_{max} \leq S_y \tag{2}$$

$$\% \text{ Nonlinearity} \leq 5\% \tag{3}$$

$$l_1 + r_2 + \frac{l_2}{2} \leq l_c \tag{4}$$

$$\frac{l_2}{2} + r_3 + \frac{l_3}{2} \leq l_c \tag{5}$$

$$l_4 + r_4 + \frac{l_3}{2} \leq l_c \tag{6}$$

$$l_1 + d_{in} + l_{in} \leq l_c \tag{7}$$

$$l_4 + d_{out} + l_{out} \leq l_c \tag{8}$$

where $s_{max}$ is the maximum stress in the mechanism, $S_y$ is the strength of the material (assumed to be 1 GPa for polysilicon), % Nonlinearity is the maximum deviation (in percent) from linearity, and $l_c$ is a rule-of-thumb maximum length. The nonlinearity is the maximum difference from the least-squares line through each of the four output points as well as zero. The rule-of-thumb maximum length is chosen to be 400 μm, a reasonable length of MEMS parts to avoid excessive stiction. Single-criteria optimization of the geometric advantage is identical to the problem statement above with maximization of mechanical advantage replaced with maximization of geometric advantage. Given the large number of design variables, length of time required for each FEA solution (about 10–20 seconds), and the nonlinearity of the design space, a combination of optimization algorithms was used. First, the stochastic Simulated Annealing (SA) algorithm was used to quickly and randomly search the entire design space to find the most promising region. This was used as a starting point for the gradient-driven GRG method, which refined the design until optimal performance was achieved.

Figure 2:
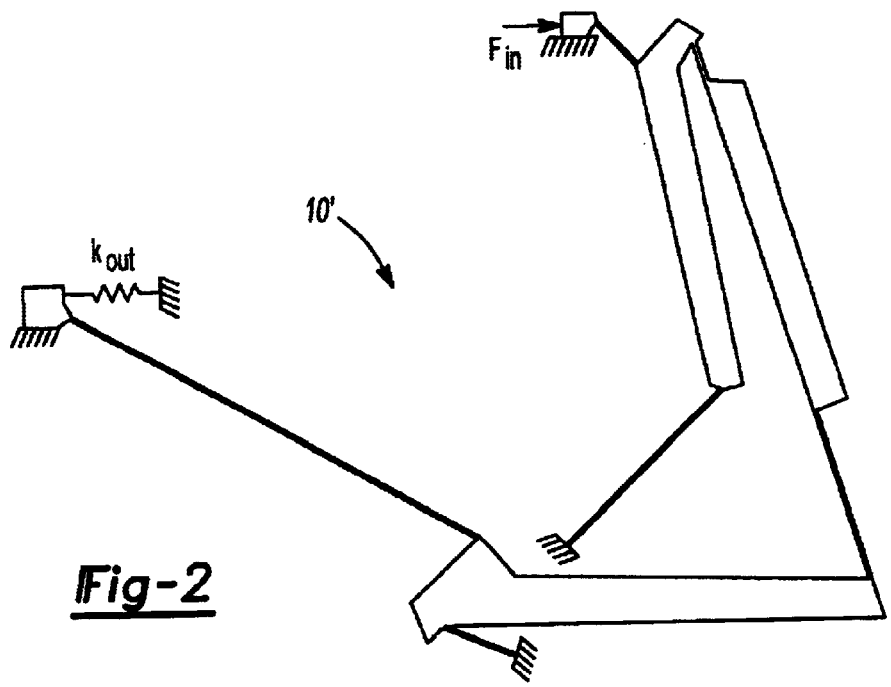
FIG. 2 is a schematic view illustrating a compliant micro mechanism that is optimized for maximum mechanical advantage for an output stiffness of 10 N/m.

The mechanical advantage optimization problem, Eq. (1), was solved using the method outlined above. The resulting design, which maximizes the force amplification for the chosen topology under the loading condition $k_{out}$=10 N/m, is shown in FIG. 2 at reference 10'. The active constraints for this design are Eq. (3), the non-linearity constraint, and Eq. (7), which limits the total length of the input arm. The input force will be amplified by a factor of 6.25.

Figure 3:
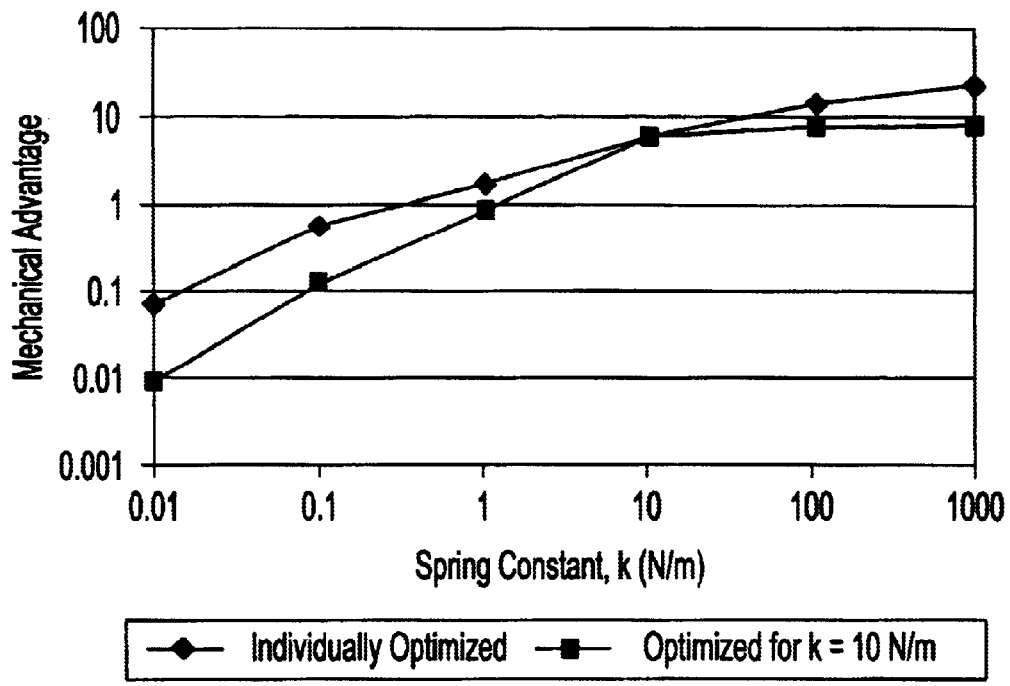
FIG. 3 is a graph illustrating mechanical advantage versus spring constant, $k_{out}$ for individually optimized designs and a design optimized for an output stiffness of 10 N/m.

As best seen in FIG. 3, this procedure was repeated for each of the spring constants, $k_{out}$, in the chosen design space, with each solution of the optimization problem producing a unique design. The performance of the individually optimized designs is plotted with the performance of a single design (optimized for $k_{out}$=10 N/m) when attached to output springs of varying magnitude. The figure demonstrates that a single design does not span the space; instead, a design tailored for the desired output load should be used. This is because the lengths and widths of the flexural pivots are optimized to support the given load. At lower loads, the pivots are too stiff, so that they require additional energy to deflect, while at higher loads they are not stiff enough, and do not adequately bear the output force.

Figure 4:
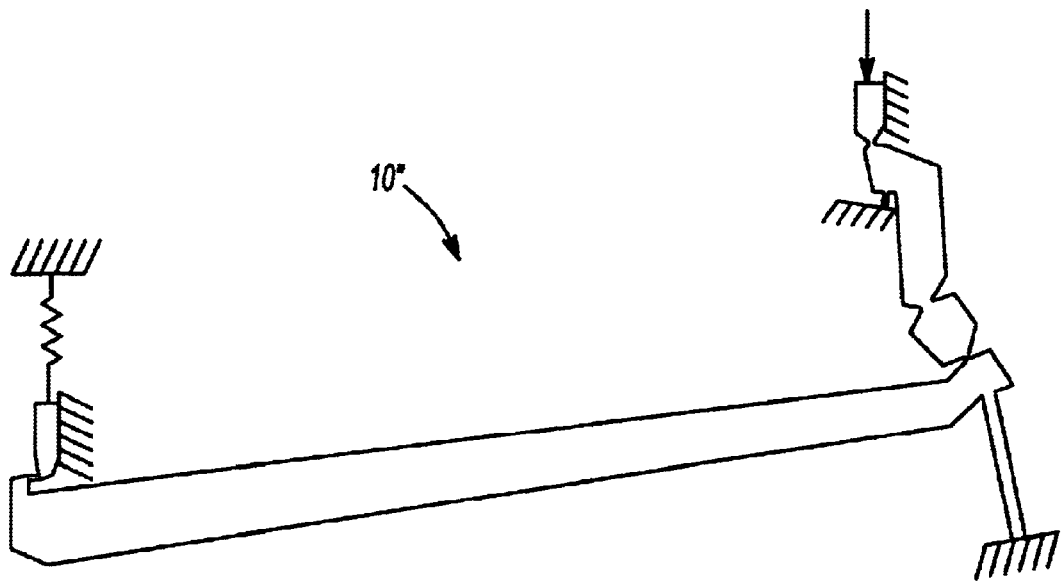
FIG. 4 is a schematic view illustrating a compliant micro mechanism that is optimized for maximum geometric advantage for an output stiffness of 10 N/m.
Figure 5:
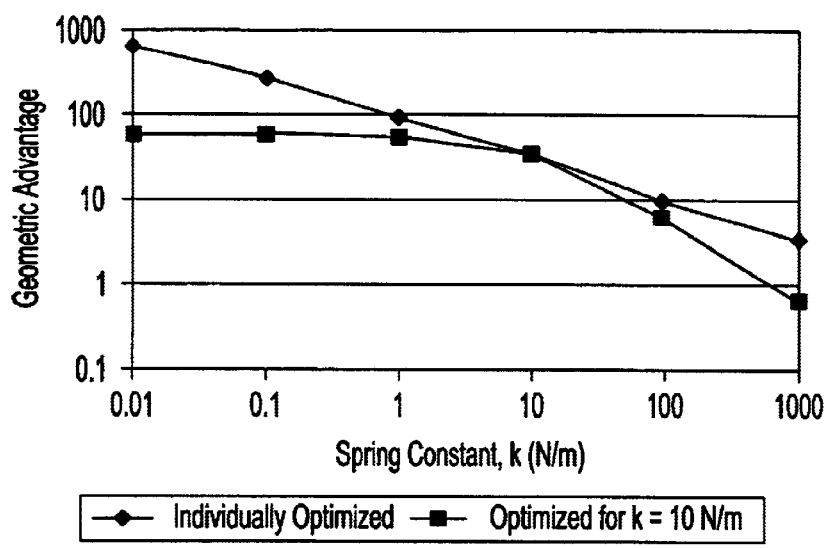
FIG. 5 is a graph illustrating geometric advantage versus spring constant, $k_{out}$ for individually optimized designs and a design optimized for an output stiffness of 10 N/m.

The procedure utilized to produce the optimal mechanical advantage designs for each of the design scenarios can be repeated to maximize geometric advantage. Eq. (1), with an objective function of geometric advantage (GA) instead of mechanical advantage (MA), is solved for each value of the parameter $k_{out}$. The resulting optimal design for $k_{out}$=10 N/m is shown in FIG. 4 and generally indicated by 10". This design has a geometric advantage of 30.27. As in the force example, each of the designs for different output loads is distinct to the spring constant utilized to obtain it. This is again illustrated by graphing the performance of the individually optimized designs against the single design, obtained when k=10 N/m, operating under all k values (FIG. 5).

The force amplification results detailed above are obtained at the expense of geometric advantage. For the case where k=10 N/m and $F_{max}$=6.25, the displacement is reduced by a factor of 0.114. Similarly, geometric advantage is obtained at the expense of mechanical advantage. For the same spring constant, the optimal geometric advantage is 30.27 and the corresponding force factor is 0.009342.

Figure 6:
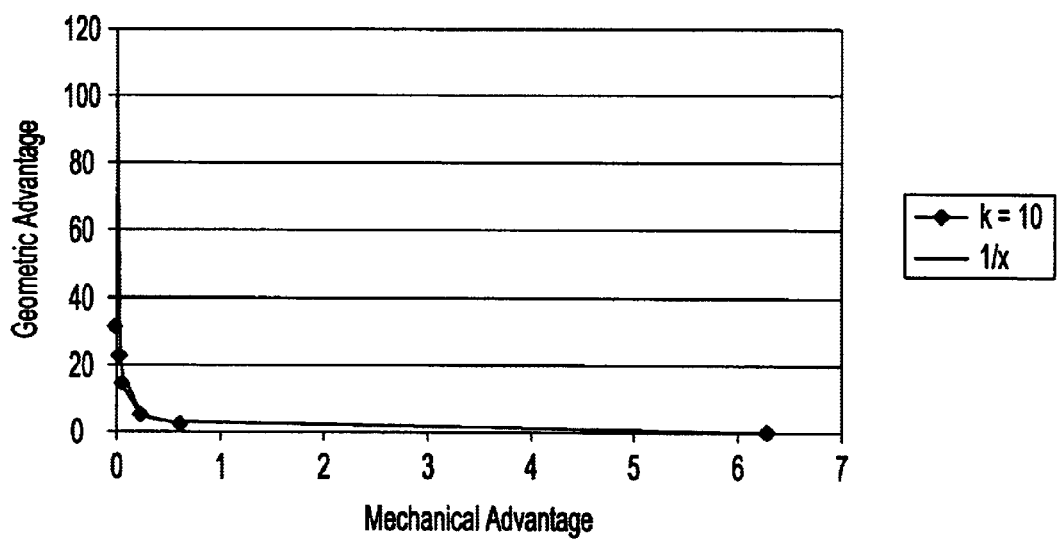
FIG. 6 is a Pareto set graph illustrating geometric advantage versus mechanical advantage.
Figure 7:
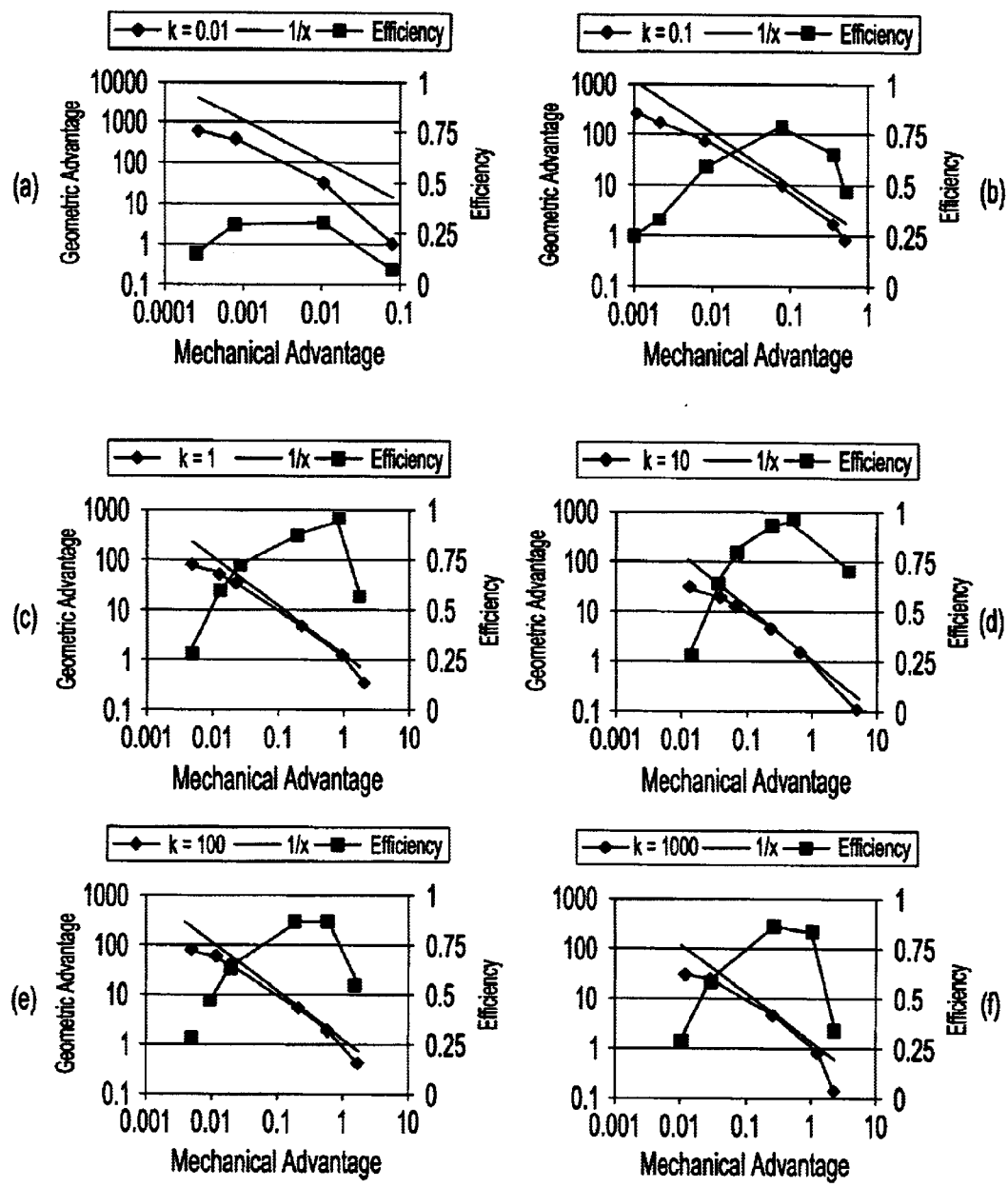
FIGS. 7(a)–(f) is a series of log-log graphs illustrating geometric advantage versus mechanical advantage versus efficiency for an output stiffness of 0.01, 0.1, 1, 10, 100, and 1000 N/m, respectively.

This trade-off can be explored for a given $k_{out}$ by posing the optimization problem, Eq. (1), as a multi-criteria optimization problem. The two objective functions are mechanical and geometric advantage. Each objective is weighted inversely proportional to the other and the sum of the two weights must always equal 1. When $F_{max}$ has a weight of 1, $G_{max}$ has a weight of 0 and the problem becomes a simple mechanical advantage maximization problem. The converse is also true. By varying these weights and solving the multi-criteria problem, a Pareto set detailing the mechanical geometric advantage trade-off is generated. For a simple ideal lever, this trade-off has a 1/x relationship. The better the MEMS devices generated here perform, the more closely they will approach this ideal. A Pareto set for $k_{out}$=10 N/m is shown in FIG. 6, along with a graph of the line 1/x. That the line representing the Pareto set, or family of optimal designs, is so close to 1/x indicates that the topology chosen for this device is efficient. The relationship in the two lines is more clearly seen in a log-log plot, FIG. 7(d).

Another way of looking at the deviation of the Pareto-optimal designs from the ideal is through design efficiency. Efficiency is calculated by multiplying the mechanical and geometric advantages of a given design, and is a measure of how much of the input energy goes to the output. Efficiency for the $k_{out}$=10 N/m design is plotted in FIGS. 7(a)–(f). The curves presented in FIGS. 7(a)–(f) illustrate that efficiency tends to be low for designs maximizing a single objective. When both mechanical and geometric advantages are considered in the multi-criteria objective function, efficiency improves. The efficiency for low $k_{out}$ is much less than that for higher $k_{out}$ designs. This may be due to the extremely weak output spring, which requires a much larger displacement to store the same amount of energy as compared to the other designs. Hence, a disproportionate amount of energy is used to deform the mechanism.

Figure 8:
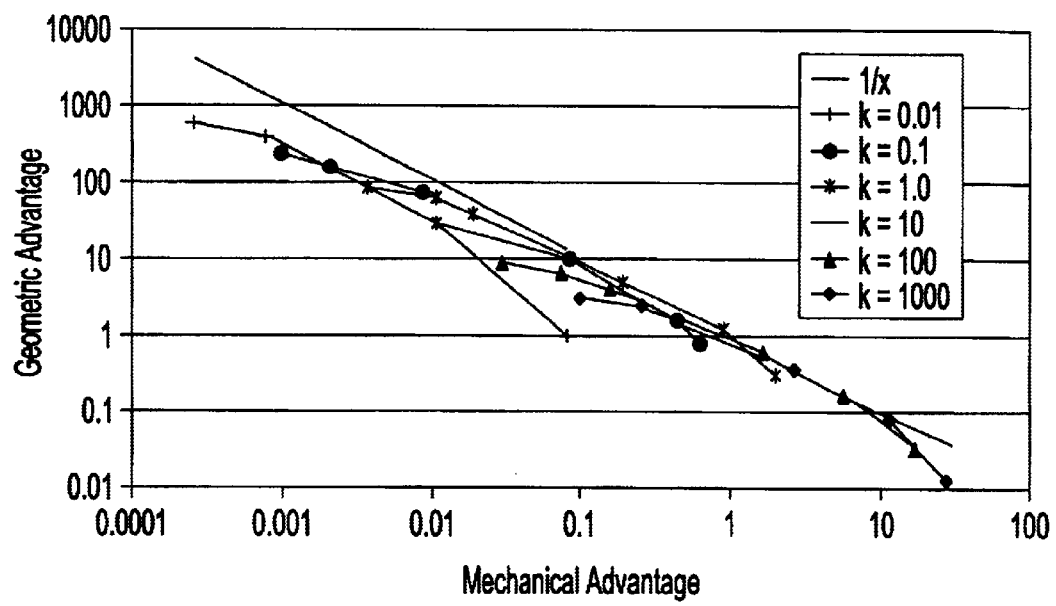
FIG. 8 is a Pareto set graph illustrating geometric advantage versus mechanical advantage for various spring constants.

Pareto sets can be generated for each value of the parameter k (FIG. 8). Taken together, these constitute a Pareto surface. Each point on this surface is an optimal design. Given a value for any two of the three axes (k, $F_{max}$, and $G_{max}$), the optimal value for the third can be read from the graph. Two-dimensional plots of the Pareto set for each value of k are in FIGS. 7(a)–(f). They show how the nature of the designs changes with the resistive load, $k_{out}$. As $k_{out}$ increases, so does the mechanical advantage that the topology is able to achieve (to a maximum of 23.7). At the same time, the maximum geometric advantage decreases for these same designs. Likewise, as $k_{out}$ decreases, geometric advantage increases (to a maximum of 588) and mechanical advantage decreases.

Size optimization of compliant micro mechanism 10 topology was performed to find designs that maximized geometric or mechanical advantage. The multi-criteria optimization problem was also solved to develop the Pareto set for a wide range of output load stiffness. The results show that a single Pareto optimal design behaves very differently depending on the size of the output load. Thus, design optimization should be performed separately in different design problems to tailor the compliant mechanism to the input and output loads of each problem. The results presented here show the values of mechanical and geometric advantage, which are possible for the given mechanism topology for many different values of output stiffness. Each Pareto set showed behavior near the ideal 1/x curve, indicating that the prescribed topology performs well over a wide range of output loads.

The results also show that the geometric advantage of devices with low output stiffness tends to be much higher than that of designs with high output stiffness. Conversely, the mechanical advantage is larger for designs with stiff output resistance. This is because a stiff output spring develops force more quickly than a weak output spring, while a weak output spring deflects more easily than a stiff spring. This behavior is advantageous for design, where force amplification is generally desired in cases with a large output load, and displacement amplification is desired in case of a small output load that must be moved a long distance. Depending on the loading conditions, the topology investigated here allows geometric advantage as high as 588 and mechanical advantage as high as 23.7, allowing use in thermal or piezoelectric actuation, as well as force transducers such as accelerometers or tensile-test systems.

The efficiency of the Pareto-optimal designs, which relates input and output energy, was also studied. In general, the designs with weak output stiffness have a very low efficiency due to the large deflections required to store energy in the weak output springs. These large deflections require more of the input energy to be used to deflect the compliant mechanism. In addition, each of the Pareto sets studied (at each value of $k_{out}$) showed a tapering of efficiency for designs that maximized mechanical or geometric advantage alone. Efficiency increased for multi-criteria optima, where both mechanical and geometric advantage were maximized subject to various weights. Hence, for a given design problem, either geometric or mechanical advantage can generally be improved only at the expense of efficiency, creating a design trade-off in which the designer must choose the acceptable efficiency while still maximizing mechanism performance.

Alternatively, the micro-mechanism of the present invention may be used as part of a micro-mechanism antenna in millimeter/micrometer-wave wireless communication systems. Such micro-mechanism antennas would be small, lightweight, and capable of being integrated on a single monolithic chip. Additionally, micro-mechanism actuators could be used to change the characteristics of the micro-mechanism antenna to allow directional or scanning capabilities. That is, a fully compliant micro-mechanism according to the present invention would be a valuable part of a reconfigurable antenna system to allow small-stroke actuators to produce larger-scale motions of the antenna elements. Such an antenna system would allow broadband radar and communications systems with increased functionalities for modern ships, airplanes, and space vehicles, without requiring a high power or a large volume.

Specifically, according to another embodiment, the fully compliant micro-mechanism could be attached to a dipole, which is essentially a straight wire. By shielding the micro-mechanism using a conductive box, the micro-mechanism could move the antenna in and out of the conductive box, effectively creating a variable-length dipole. The radiation pattern of a dipole changes significantly as its length changes from about a single wavelength to 1.5 wavelengths. Thus, for a 1 mm wavelength (300 GHz), 500 microns of motion would create a large change in the direction of the radiation pattern of the dipole.

According to yet another embodiment, an array is created of several dipoles, in a line, such that a prescribed distance separates each. In this case, an antenna array would be created, which has larger directivity and improved gain relative to a single dipole acting alone. If each antenna were operated with a phase shift, then the angle at which the main radiation beam leaves the array will change depending on the distance between the antennas. Thus, if the distance between the antennas where controlled using micro actuators attached to micro-mechanisms, then a scanning array could be created, which would scan the radiation beam over a wide angular range.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A device for amplifying mechanical and geometrical advantage, said device comprising:
    a base structure;
    a first link member having a first end and a second end;
    a first compliant flexural joint pivotally interconnecting said first end of said first link member to said base structure;
    a second link member having a first end and a second end;
    a second compliant flexural joint pivotally interconnecting said first end of said second link member to said base structure;
    a third link member having a first end and a second end;
    a third compliant flexural joint pivotally interconnecting said first end of said third link member to said second end of said first link member; and
    a fourth compliant flexural joint pivotally interconnecting said second end of said third link member to said second end of said second link member,
    wherein said base structure, first link member, second link member, and third link member cooperate to define a four-bar linkage, said four-bar linkage receiving an input force and providing an amplified force or displacement output in response thereto.

2. The device according to claim 1 wherein said first link member, said second link member, and said third link member are each fully compliant.

3. The device according to claim 2 wherein each of said first, second, and third compliant flexural joints are each fully compliant to minimize backlash, friction, and wear.

4. The device according to claim 1 wherein said the geometric advantage and mechanical advantage are simultaneously maximized.

5. The device according to claim 4 wherein said geometric advantage is approximately 588.

6. The device according to claim 4 wherein said mechanical advantage is approximately 23.7.

7. The device according to claim 1, further comprising:
    an input member;
    a fifth compliant flexural joint pivotally interconnecting a midpoint of said first link member to said input member;
    an output member; and
    a sixth compliant flexural joint pivotally interconnecting a midpoint of said second link member to said output member.

8. A device for amplifying mechanical and geometrical advantage, said device comprising:
    a base structure;
    a first link member having a first end and a second end;
    a first compliant flexural joint pivotally interconnecting said first end of said first link member to said base structure;
    a second link member having a first end and a second end;
    a second compliant flexural joint pivotally interconnecting said first end of said second link member to said base structure;
    a third link member having a first end and a second end;
    a third compliant flexural joint pivotally interconnecting said first end of said third link member to said second end of said first link member; and a fourth compliant flexural joint pivotally interconnecting said second end of said third link member to said second end of said second link member;

an input member;

a fifth compliant flexural joint pivotally interconnecting a midpoint of said first link member to said input member;

an output member; and a sixth compliant flexural joint pivotally interconnecting a midpoint of said second link member to said output member, wherein said base structure, first link member, second link member, and third link member cooperate to define a compliant four-bar linkage, said compliant four-bar linkage receiving an input force and providing an amplified force or displacement output in response thereto.

9. The device. according to claim 8 wherein said first, second, third, fourth, fifth, and sixth compliant flexural joints are sized such that the geometric advantage and mechanical advantage are simultaneously maximized.

10. The device according to claim 9 wherein said geometric advantage is approximately 588.

11. The device according to claim 9 wherein said mechanical advantage is approximately 23.7.

* * * * *

UNITED STATES PATENT AND TRADEMARK OFFICE
CERTIFICATE OF CORRECTION

PATENT NO. : 6,748,818 B2
DATED : June 15, 2004
INVENTOR(S) : Brian D. Jensen, Michael Farina and Katsuo Kurabayashi It is certified that error appears in the above-identified patent and that said Letters Patent is hereby corrected as shown below:

Column 7,
Line 64, "where" should be -- were --.

Column 8,
Line 26, after "said" delete "the".

Signed and Sealed this

Twenty-fifth Day of October, 2005

JON W. DUDAS
*Director of the United States Patent and Trademark Office*